(12) United States Patent
Chang

(10) Patent No.: US 10,833,655 B2
(45) Date of Patent: Nov. 10, 2020

(54) DRIVER CHIP AND DRIVING METHOD OF A HALF BRIDGE CIRCUIT

(71) Applicant: NUVOTON TECHNOLOGY CORPORATION, Hsinchu (TW)

(72) Inventor: Yu-Chi Chang, Hsinchu Science-based Park (TW)

(73) Assignee: Nuvoton Technology Corporation, Hsinchu (TW)

( * ) Notice: Subject to any disclaimer, the term of this patent is extended or adjusted under 35 U.S.C. 154(b) by 0 days.

(21) Appl. No.: 16/047,405

(22) Filed: Jul. 27, 2018

(65) Prior Publication Data

US 2019/0158071 A1    May 23, 2019

(30) Foreign Application Priority Data

Nov. 17, 2017   (TW) .............................. 106139950 A

(51) Int. Cl.
| | |
|---|---|
| *H03K 3/00* | (2006.01) |
| *H03K 3/012* | (2006.01) |
| *H03K 19/0185* | (2006.01) |
| *H02M 3/07* | (2006.01) |
| *H02M 3/158* | (2006.01) |
| *H02M 1/08* | (2006.01) |
| *H03K 17/687* | (2006.01) |

(52) U.S. Cl.
CPC .............. *H03K 3/012* (2013.01); *H02M 1/08* (2013.01); *H02M 3/07* (2013.01); *H02M 3/158* (2013.01); *H03K 19/018507* (2013.01); *H03K 17/687* (2013.01); *H03K 2217/0063* (2013.01); *H03K 2217/0072* (2013.01)

(58) Field of Classification Search
CPC ........... H03K 3/012; H03K 19/018507; H03K 2217/0063; H03K 17/687; H03K 2217/0072; H02M 1/08; H02M 3/158; H02M 3/07
USPC ........................................................ 327/109
See application file for complete search history.

(56) References Cited

U.S. PATENT DOCUMENTS

| | | | | |
|---|---|---|---|---|
| 5,917,359 A | * | 6/1999 | Fukunaga | ............ H03K 3/0375 327/18 |
| 8,044,699 B1 | * | 10/2011 | Kelly | ............. H03K 19/018521 327/333 |
| 8,633,745 B1 | * | 1/2014 | Peterson | .......... H03K 17/08104 327/156 |
| 9,979,397 B1 | * | 5/2018 | Zhu | .................. H03K 17/04123 |
| 2008/0315938 A1 | * | 12/2008 | Ishikawa | ............. H03K 17/567 327/333 |
| 2010/0026361 A1 | * | 2/2010 | Jung | ............. H03K 19/018521 327/333 |

* cited by examiner

*Primary Examiner* — Ryan Jager
(74) *Attorney, Agent, or Firm* — Muncy, Geissler, Olds & Lowe, P.C.

(57) ABSTRACT

A driver chip includes a high side input terminal, a pulse generator, a level shift, a current detector, a high side output controller, and a high side output terminal. The high side input terminal receives the high side input signal and the pulse generator transfers the high side input signal into the rise pulse signal and the fall pulse signal. The current detector detects the first current and the second current flowing through the level shift, and the high side output controller generates the high side output signal. The high side output terminal controls the switching of the high side transistor by the high side output signal.

5 Claims, 4 Drawing Sheets

DRIVER CHIP AND DRIVING METHOD OF A HALF BRIDGE CIRCUIT

CROSS-REFERENCE TO RELATED APPLICATION

This application claims priority from Taiwan Application No. 106139950, filed on Nov. 17, 2017, in the Taiwan Intellectual Property Office, the content of which is hereby incorporated by reference in their entirety for all purposes.

BACKGROUND OF THE INVENTION

Field of the Invention

The present invention relates to a driver chip and a driving method of a half bridge circuit, and especially relates to a driver chip and a driving method which make use of single level shift to drive the high side transistor of a half bridge circuit.

Description of the Related Art

In the prior art, the driver chip of a half bridge circuit is used to control the switching of an upper arm transistor and a lower arm transistor to provide the needed voltage to the load. The driver chip is divided into the high side and the low side. The voltage difference between the high side and the low side may be up to 100-600 volts, or in some cases, even more than 1000 volts. However, the switch signal transmitted by a normal controller is not capable to drive the high side transistor, and a level shift is needed to shift the level of the signal to drive the high side transistor. In this case, the level shift needs to occupy a quite large area of the chip in order to operate well in the high voltage status, which limits the layout, increases the cost and degrades the performance of the chip.

In view of the aforementioned problems, the driver chip and the driving method of a half bridge circuit in the prior art still have lots of defects. Therefore, the present invention provides a driver chip and a driving method of a half bridge circuit to improve the performance and reduce the cost of the chip design.

SUMMARY OF THE INVENTION

In view of the aforementioned problems of the prior art, one objective of the present invention provides a driver chip of a half bridge circuit and a method of driving a half bridge, which implements driving the high side transistor of the half bridge circuit by using single level shift so as to reduce the area occupied by high-voltage devices and to reduce the cost of the chip.

In accordance with one objective of the present invention, a driver chip of a half bridge circuit for controlling the switching of the high side transistor and the low side transistor is disclosed. The driver chip includes a high side input terminal, a pulse generator, a level shift, a current detector, a high side output controller and a high side output terminal. The high side input terminal receives a high side input signal. The pulse generator is electrically connected to the high side input terminal and transfers a rising edge and a falling edge of the high side input signal into a rise pulse signal and a fall pulse signal. The level shift is electrically connected to the pulse generator and generates a first current and a second current according to the rise pulse signal and the fall pulse signal respectively. The current detector is electrically connected to the level shift and detects the first current and the second current for generating a rise current signal and a fall current signal respectively. The high side output controller is electrically connected the current detector and generates a high side output signal according to the rise current signal and the fall current signal. The high side output terminal is electrically connected to the high side output controller and the high side transistor and outputs the high side output signal to control the switching of the high side transistor.

Preferably, the driver chip may include a current supply circuit electrically coupled between the pulse generator and the level shift.

Preferably, the current supply circuit may include a first switch and a second switch, the rise pulse signal controls the first switch to be switched on such that the first current flows through the level shift, and the fall pulse signal controls the second switch to be switched on such that the second current flows through the level shift.

Preferably, the driver chip may include a voltage supply circuit electrically coupled between the pulse generator and the level shift.

Preferably, the voltage supply circuit may include a third switch and a fourth switch, the rise pulse signal controls the third switch to provide a first voltage to the level shift, and the fall pulse signal controls the fourth switch to provide a second voltage to the level shift.

Preferably, the driver chip of a half bridge may include a low side input terminal for receiving a low side input signal and a low side output terminal for outputting a low side output signal to control the switching of the low side transistor.

Preferably, the high side transistor may be electrically connected to a charge pump may include an external diode and a capacitor.

In accordance with another objective of the present invention, a driver chip of a half bridge circuit for controlling the switching of the high side transistor and the low side transistor is disclosed. The driver chip of includes a high side input terminal, a pulse generator, single level shift, a pulse detector, a high side output controller and a high side output terminal. The high side input terminal receives a high side input signal. The pulse generator is electrically connected to the high side input terminal and transfers the rising edge and the falling edge of the high side input signal into a rise pulse signal and a fall pulse signal. The level shift is electrically connected to the pulse generator and configured to transmit the rise pulse signal and the fall pulse signal. The pulse detector is electrically connected to the level shift and detects the rise pulse signal and the fall pulse signal outputted by the level shift. The high side output controller is electrically connected to the pulse detector and generates a high side output signal according to a sequence of the rise pulse signal and the fall pulse signal, or pulse widths of the rise pulse signal and the fall pulse signal. The high side output terminal is electrically connected to the high side output controller and the high side transistor and outputs the high side output signal to control the switching of the high side transistor.

Preferably, the pulse detector may include a pulse counting circuit for counting a number of pulses transmitted by the level shift and judge whether the level shift outputs the rise pulse signal or the fall pulse signal according to the number of pulses.

Preferably, the pulse detector may include a pulse width detecting circuit for detecting a pulse width transmitted by the level shift and judge whether the level shift outputs the rise pulse signal or the fall pulse signal according to the pulse width.

Preferably, the driver chip of a half bridge circuit may further include a low side input terminal for receiving a low side input signal and a low side output terminal for outputting a low side output signal to control the switching of the low side transistor.

Preferably, the high side transistor may be electrically connected to a charge pump and the charge pump may include an external diode and a capacitor.

In accordance with another objective of the present invention, a driving method of a half bridge circuit for controlling the switching of a high side transistor and a low side transistor is disclosed. The driving method of a half bridge circuit includes: receiving a high side input signal; generating a rise pulse signal and a fall pulse signal according to the high side input signal and transmitting the rise pulse signal and the fall pulse signal to a level shift; detecting a first current and a second current which flow through the level shift and generating a rise current signal and a fall current signal according to the first current and the second current respectively; generating a high side output signal according to the rise current signal and the fall current signal; and transmitting the high side output signal to control the switching of the high side transistor.

Preferably, the level shift may generate the first current corresponding to the rise pulse signal and the second current corresponding to the fall pulse signal by a current supply circuit.

Preferably, the current supply circuit may control a first switch to be switched on by the rise pulse signal such that the first current flows through the level shift and control a second switch to be switched on by the fall pulse signal such that the second current flows through the level shift.

Preferably, the level shift may provide a first voltage corresponding to the rise pulse signal and a second voltage corresponding to the fall pulse signal by a voltage supply circuit to generate the first current and the second current respectively.

Preferably, the voltage supply circuit may control a third switch to be switched on by the rise pulse signal to provide the first voltage and control a fourth switch to be switched on by the fall pulse signal to provide the second voltage.

According to the above description, the driver chip and the driving method of a half bridge circuit of the present invention may have one or more than one of advantages described below:

(1) The driver chip and the driving method of a half bridge circuit may drive loads of various high voltage applications.

(2) The driver chip and the driving method of a half bridge circuit may shift the level of the signal by single level shift so as to drive the switching of the high side transistor. That is, the number of the used level shifts is reduced, which reduces the area of the chip occupied by high-voltage devices and reduces the cost for manufacturing the chip.

(3) The driver chip and the driving method of a half bridge circuit may create the high side output signal through the current detection or the pulse detection such that the high side output signal may correspond to the inputted control signal to improve the operation efficiency.

DETAILED DESCRIPTION OF THE PREFERRED EMBODIMENTS

In order to provide understanding of the technical features, the content, the advantages and the achievable performance of the present invention, the present invention are presented through embodiments described below in detail in accordance with the accompanying drawings. The accompanying drawings are intended to illustrate and assist the specification and do not present the actual ratio and the precise configuration. Consequently, the ratio and the configuration relationship in the accompanying drawings should not be interpreted to limit the scope of claims of the present invention.

Figure 1:
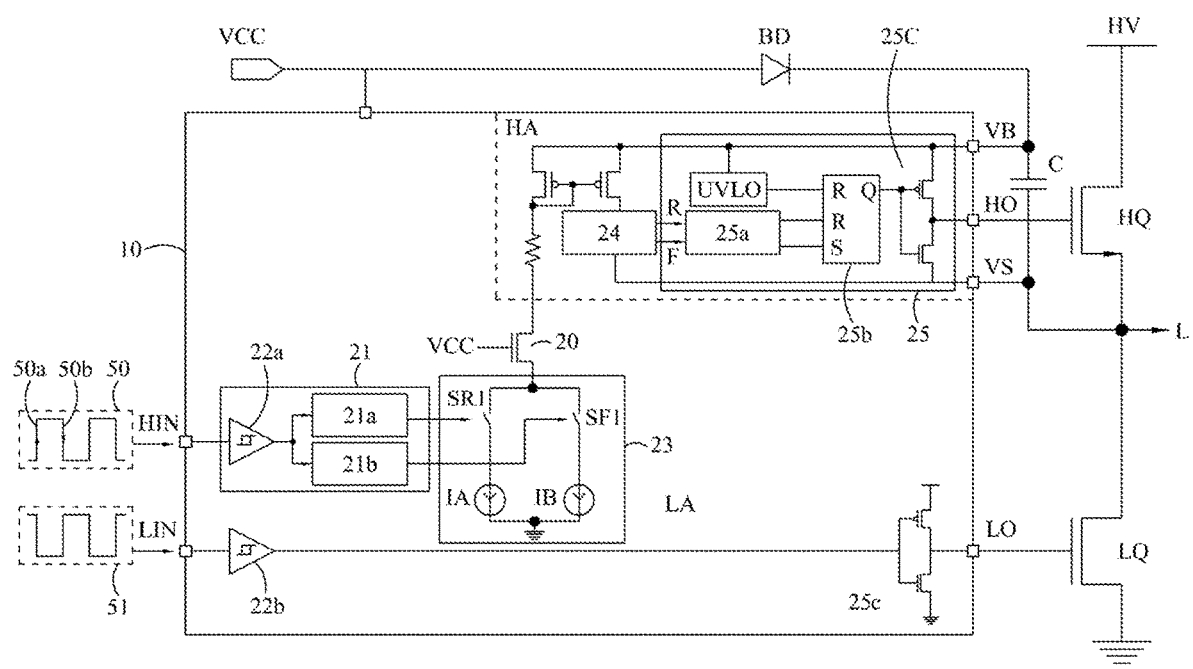
FIG. 1 illustrates the circuit of the driver chip of a half bridge circuit according to an embodiment of the present invention.

Referring to FIG. 1, which illustrates the circuit of the driver chip of a half bridge circuit according to an embodiment of the present invention. As shown in FIG. 1, the driver chip of the half bridge circuit 10 is electrically connected to a high side transistor HQ, a low side transistor LQ and a charge pump. One terminal of the high side transistor HQ is electrically connected to a high voltage power source HV and another terminal of the high side transistor HQ is electrically connected to the load L. One terminal of the low side transistor LQ is electrically connected to the load L and another terminal of the low side transistor LQ is connected to ground. The driver chip of the half bridge circuit 10 is used to control the switching of the upper arm high side transistor HQ and the lower arm low side transistor LQ to provide the voltage and current to the load L. Besides, the charge pump includes an external diode BD and a capacity C, and receives the provided voltage VCC, and is electrically connected to a high side power source terminal VB of the driver chip of the half bridge circuit 10. The driver chip of the half bridge circuit 10 includes the high side input terminal HIN and the low side input terminal LIN respective receiving the high side input signal 50 and the low side input signal 51 of a micro-controller. The foregoing input signals may be a pulse width modulation signal, which has a waveform having the rising edge 50*a* and the falling edge 50*b* deciding whether the transistor is in an on or off state. The driver chip of the half bridge circuit 10 is divided into the high side area HA and the low side area LA. The high side area HA includes the high side output terminal HO electrically connecting to the high side transistor HQ for driving the high side transistor HQ by the high side output signal. The low side area LA includes the low side output terminal LO electrically connecting to the low side transistor LQ for driving the low side transistor LQ by the low side output signal.

When the high side transistor HQ is switched on, the high voltage power source HV is provided to the load L and the high side floating ground terminal VS simultaneously undergoes high voltage. In this case the voltage difference between the high side area HA and the low side area LA of the driver chip of the half bridge circuit 10 may be up to 100 volts to 600 volts, or even up to 1200 volts. Therefore, the high side input signal 50 of the micro-controller cannot directly drive the high side transistor HQ and the level shift 20 is needed to shift the signal to a high voltage level for effectively driving the high side transistor HQ. In the prior art, the rising edge 50a and the falling edge 50b of the high side input signal 50 are respectively transferred into pulse signals, two level shifts are needed and in charge of the transformation of the rising signal the and falling signal respectively, and the high side area HA outputs the high side output signal. However, the MOSFET used as a level shift occupies a larger area of the chip in order to operate well in a high voltage state and hence increasing the manufacturing cost.

In the present embodiment, only one level shift is used (the level shift 20). The high side input signal 50 inputted from the high side input terminal HIN is transmitted to the pulse generator 21. The rising edge 50a and the falling edge 50b of the high side input signal 50 is transferred into the rise pulse signal 21a and the fall pulse signal 21b by the comparator 22a. The rise pulse signal 21a and the fall pulse signal 21b is then transmitted to the current supply circuit 23. The current supply circuit 23 includes the first switch SR1 and the second switch SF1. The first switch SR1 is switched on by the rise pulse signal 21a such that the first current provided by the first current source IA flows through the level shift 20. The second switch SF1 is switched on by the fall pulse signal 21b such that the second current provided by the second current source IB flows through the level shift 20. The current supply circuit 23 is electrically connected to the level shift 20. The current value of the first current may be different from that of the second current. For example, the current value of the first current may be larger than that of the second current, which varies the current signal transmitted to the high side area HA through the level shift 20. The current detector 24 is configured in the high side area HA in order to detect the first current and the second current, and a detected result for the first current is used as the rise current signal and a detected result for the second current is used as the fall current signal, and the two detected results are transmitted to the high side output controller 25. The high side output controller 25 includes a logic circuit 25a, a flip-flop 25b and an inverter 25C. The high side output controller 25 generates the high side output signal according to the rise current signal and the fall current signal. The high side output signal is transmitted to the high side transistor HQ through the high side output terminal HO for controlling the switching of the high side transistor HQ.

The high side output controller 25 may further include an under-voltage lockout circuit UVLO for detecting the voltage of the high side power source terminal VB. When the voltage of the high side power source terminal VB exceeds a pre-determined value, the under-voltage lock circuit UVLO switches off the power source to prevent the circuit from damage. Besides, the low side input signal 51 is received through the low side input terminal LIN. The comparator 22b judges the rising edge trigger signal and the falling edge trigger signal of the low side input signal 51 and is electrically connected to the low side inverter 25c. The low side output signal corresponding to the low side input signal 51 is then transmitted through the low side output terminal LO to control the switching of the low side transistor LQ.

Figure 2:
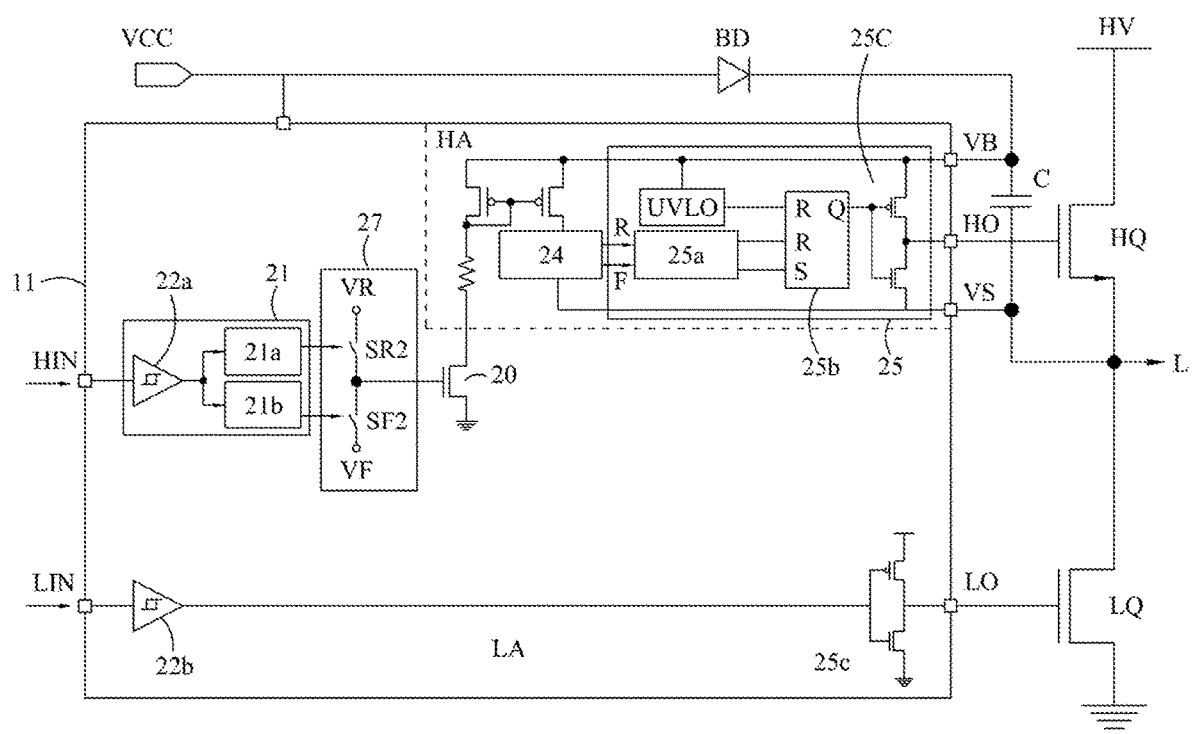
FIG. 2 illustrates the circuit of the driver chip of a half bridge circuit according to another embodiment of the present invention.

Referring to FIG. 2, which illustrates the circuit of the driver chip of a half bridge circuit according to another embodiment of the present invention. As shown in FIG. 2, the driver chip of a half bridge circuit 11 includes a high side input terminal HIN, a low side input terminal LIN, a pulse generator 21, a level shift 20, a current detector 24, a high side output controller 25, a high side output terminal HO and a low side output terminal LO. The same symbols denote the same elements of FIG. 1 and the like descriptions are omitted. In the present embodiment, the pulse generator 21 is electrically connected to the voltage supply circuit 27 and electrically connected to the gate of the single level shift 20 through the voltage supply circuit 27. Due to the characteristics of the MOSFET, the level shift 20 controls the current flowing therethrough according to the voltage applied thereon. The current detector 24 then detects the current value of the current flowing therethrough to judge whether the level shift 20 outputs a rise current signal or a fall current signal.

The voltage supply circuit 27 includes the third switch SR2 and the fourth switch SF2. The third switch SR2 is switched on by the rise pulse signal 21a for providing the first voltage VR to the level shift 20. The fourth switch SF2 is switched on (on state) by the fall pulse signal 21b for providing the second voltage VF to the level shift 20. The first voltage is different from the second voltage. For example, the first voltage may be higher than the second voltage. When the level shift 20 receives different voltages, the current transmitted to the high side varies accordingly. Because the current detector 24 detects the current to judge the corresponding rising edge and falling edge of the high side input signal 50, the high side output signal has the same pattern with the high side input signal 50. The high side output signal transmitted through the high side output terminal controls the switching of the high side transistor HQ as well. Similarly, the low side input signal 51 is inputted through the low side input terminal LIN, and the low side output signal corresponding to the low side input signal 51 is then outputted through the low side output terminal to control the switching of the low side transistor.

Figure 3:
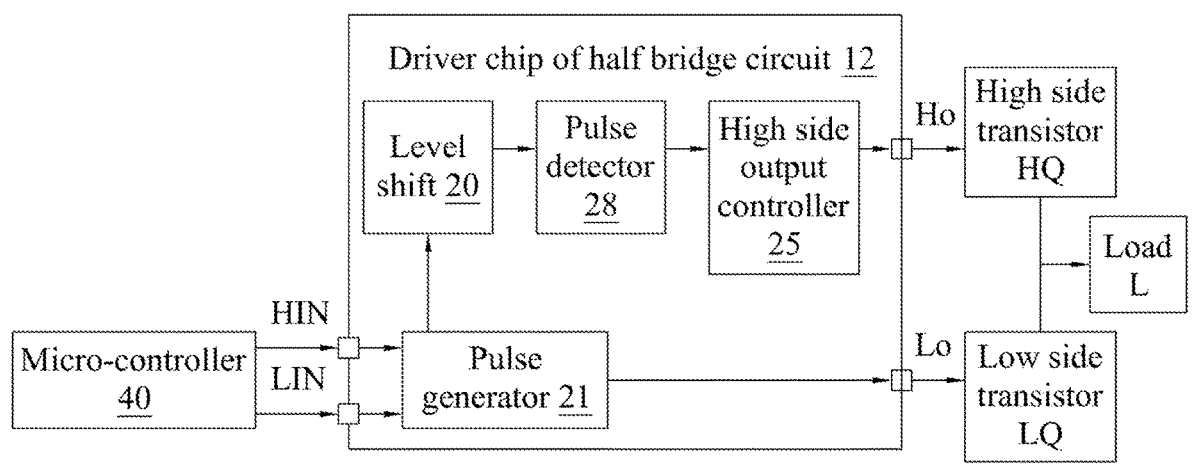
FIG. 3 illustrates the block diagram of the driver chip of a half bridge circuit according to another embodiment of the present invention.

Referring to FIG. 3, which illustrates the block diagram of the driver chip of a half bridge circuit according to another embodiment of the present invention. As shown in FIG. 3, the driver chip of a half bridge circuit 12 includes a high side input terminal HIN, a low side input terminal LIN, a pulse generator 21, a level shift 20, a high side output controller 25, a high side output terminal HO, and a low side output terminal LO. The driver chip of a half bridge circuit 12 may transmit the high side input signal to the high side input terminal HIN and the low side input signal to the low side input terminal LIN by the micro-controller 40. The high side output terminal HO and the low side output terminal LO of the driver chip of a half bridge circuit 12 are electrically connected to the high side transistor HQ and the low side transistor LQ, respectively. The high side output signal and the low side output signal control the switching of the transistors so as to drive the load L. The same symbols denote the same elements of the foregoing embodiments and the like descriptions are omitted. The different features between the present embodiment and the foregoing embodiments are described below.

In the present embodiment, upon receipt of the high side input signal, the pulse generator generates the rise pulse signal and the fall pulse signal according to the rising edge and the falling edge of the signal respectively. The level shift 20 shifts the voltage level. Because only one level shift is used (the level shift 20), it is necessary to judge whether the rise pulse signal or the fall pulse signal is outputted by the level shift 20 and transmitted by the level shift 20 in order to generate a correct high side output signal corresponding to the high side input signal. In the present embodiment, the pulse detector 28 is electrically connected to the level shift 20. The pulse detector 28 may include a pulse counting circuit for counting the number of the pulses transmitted by the level shift 20. The number of pulses is then used to judge whether the level shift 20 outputs the rise pulse signal or the fall pulse signal. That is, the high side output controller can generate a high side output signal according to a sequence of the rise pulse signal and the fall pulse signal. For example, the even pulse can indicates the rise pulse signal and the odd pulse can indicate the fall pulse signal. In another embodiment, the pulse detector 28 may include a pulse width detecting circuit, which detects the pulse width of the pulse transmitted by the level shift 20 in order to judge whether the level shift 20 transmitted the rise pulse signal or the fall pulse signal.

Figure 4:
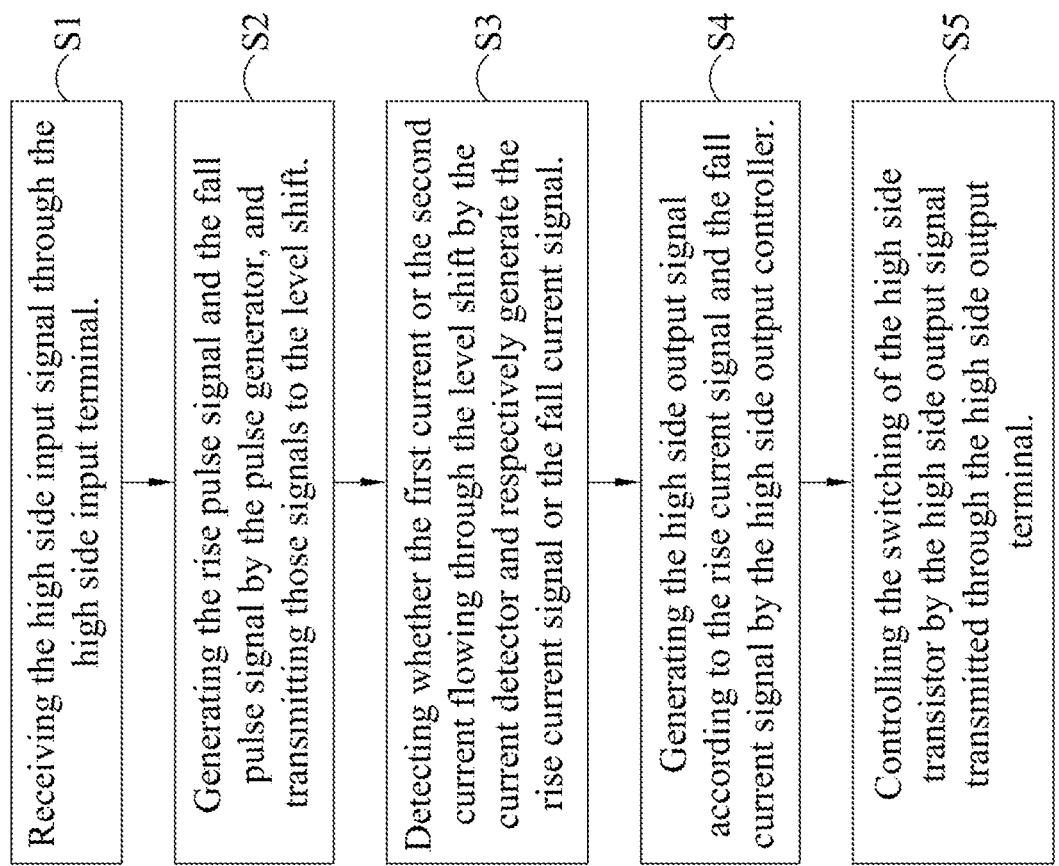
FIG. 4 illustrates the flow chart of the driving method of a half bridge circuit according to an embodiment of the present invention.

Referring to FIG. 4, which illustrates the flow chart of the driving method of a half bridge circuit according to an embodiment of the present invention. As shown in FIG. 4, the driving method includes the following steps (S1~S6):

Step S1: receiving the high side input signal through the high side input terminal. The high side input terminal and the low side input terminal of the driver chip of a half bridge circuit may receive the high side input signal and the low side input signal from the micro-controller respectively. Even though the low side input signal can directly drive the low side transistor, the high side input signal cannot directly drive the high side transistor. Therefore, the high side signal needs to be transferred through the following steps in order to drive the high side transistor.

Step S2: generating the rise pulse signal and the fall pulse signal by the pulse generator, and transmitting those signals to the level shift. The pulse generator generates the rise pulse signal the fall pulse signal according to the high side input signal. In the present embodiment, the rise pulse signal may control the first switch of a current supply to be switched on such that the first current provided by the first current source flows through the level shift. Similarly, the fall pulse signal controls the second switch to be switched on such that the second current provided by the second current source flows through the level shift. In this way, the level shift can receive the first current and the second current different from the first current. In another embodiment, the rise pulse signal can control the third switch of a voltage supply to be switched on so as to provide the first voltage, and the fall pulse signal can control the fourth switch of the voltage supply to be switched on so as to provide the second voltage. In this way, the level shift can generate the first current and the second current different from the first current due to the different voltages transmitted to the gate of the level shift.

Step S3: detecting whether the first current or the second current flowing through the level shift by the current detector and respectively generate the rise current signal or the fall current signal. A current detector may detect the current transmitted to the high side by the level shift in order to judge whether the first current corresponding to the rising edge of the high side input signal or the second current corresponding to the falling edge of the high side input signal is transmitted through the level shift. Further, the first current and the second current are then transferred into the rise current signal and the fall current signal.

Step S4: generating the high side output signal according to the rise current signal and the fall current signal by the high side output controller. The rise current signal and the fall current signal received by the logic circuit of the high side output controller trigger a driver circuit through a flip-flop so as to generate the high side output signal having the same pattern with the high side input signal.

Step S5: controlling the switching of the high side transistor by the high side output signal transmitted through the high side output terminal. The transferred high side output signal is transmitted to the high side transistor through the high side output terminal. The switching of the high side transistor is then controlled according to the rising pattern and the falling pattern of the signal.

The above description is merely illustrative and not restrictive. Any equivalent modification or change without departing from the spirit and scope of the present disclosure should be included in the appended claims.

What is claimed is:

1. A driver chip of a half bridge circuit for controlling switching of a high side transistor and a low side transistor, comprising:
   a high side input terminal receiving a high side input signal;
   a pulse generator electrically connected to the high side input terminal and transferring a rising edge and a falling edge of the high side input signal into a rise pulse signal and a fall pulse signal, respectively;
   a level shift
   a current supply circuit electrically coupled between the pulse generator and the level shift, and comprising:
      a first switch and a second switch, wherein the rise pulse signal controls the first switch to be switched on such that a first current flows through the level shift, and the fall pulse signal controls the second switch to be switched on such that a second current flows through the level shift, and a current value of the first current is different from that of the second current;
   a current detector electrically connected to the level shift and detecting the first current and the second current for generating a rise current signal and a fall current signal respectively;
   a high side output controller electrically connected the current detector and generating a high side output signal according to the rise current signal and the fall current signal; and
   a high side output terminal, electrically connected to the high side output controller and the high side transistor and outputting the high side output signal to control the switching of the high side transistor.

2. The driver chip according to claim 1, comprising a voltage supply circuit electrically coupled between the pulse generator and the level shift.

3. The driver chip according to claim 2, wherein the voltage supply circuit comprises a third switch and a fourth switch, the rise pulse signal controls the third switch to provide a first voltage to the level shift, and the fall pulse signal controls the fourth switch to provide a second voltage to the level shift.

4. The driver chip according to claim 1, further comprising:
   a low side input terminal, receiving a low side input signal; and
   a low side output terminal, outputting a low side output signal to control the switching of the low side transistor.

5. The driver chip according to claim 1, wherein the high side transistor is electrically connected to a charge pump comprising an external diode and a capacitor.

* * * * *